(12) United States Patent
Im et al.

(10) Patent No.: US 11,437,236 B2
(45) Date of Patent: Sep. 6, 2022

(54) METHODS AND SYSTEMS FOR SPOT BEAM CRYSTALLIZATION

(71) Applicant: The Trustees of Columbia University in the City of New York, New York, NY (US)

(72) Inventors: James S. Im, New York, NY (US); Wenkai Pan, New York, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 55 days.

(21) Appl. No.: 16/069,150

(22) PCT Filed: Jan. 9, 2017

(86) PCT No.: PCT/UW2017/012716
§ 371 (c)(1),
(2) Date: Jul. 10, 2018

(87) PCT Pub. No.: WO2017/120584
PCT Pub. Date: Jul. 13, 2017

(65) Prior Publication Data
US 2019/0027363 A1   Jan. 24, 2019

Related U.S. Application Data

(60) Provisional application No. 62/305,818, filed on Mar. 9, 2016, provisional application No. 62/277,355, filed (Continued)

(51) Int. Cl.
*H01L 21/02* (2006.01)
*B23K 26/00* (2014.01)
(Continued)

(52) U.S. Cl.
CPC .... *H01L 21/02686* (2013.01); *B23K 26/0006* (2013.01); *B23K 26/0622* (2015.10);
(Continued)

(58) Field of Classification Search
CPC ......... H01L 21/02686; H01L 21/02691; H01L 21/02683
See application file for complete search history.

(56) References Cited

U.S. PATENT DOCUMENTS

| 6,555,449 B1 | 4/2003 | Im et al. |
| 7,964,453 B2 | 6/2011 | Doudoumopoulos et al. |

(Continued)

FOREIGN PATENT DOCUMENTS

DE       19839718 A1 *  3/2000  ............. C30B 13/24

OTHER PUBLICATIONS

University of Tennessee, Physics Department, "The EM Spectrum": pp. 1-3 (retrieved on May 2020 from http://labman.phys.utk.edu/phys222core/modules/m6/The%20EM%20spectrum.html) (Year: 2020).*

(Continued)

*Primary Examiner* — Michele Fan
(74) *Attorney, Agent, or Firm* — Wilmer Cutler Pickering Hale and Dorr LLP

(57) ABSTRACT

Methods and systems for crystallizing a thin film provide a laser beam spot that is continually advanced across the thin film to create a sustained complete or partial molten zone that is translated across the thin film, and crystallizes to form uniform, small-grained crystalline structures or grains.

15 Claims, 7 Drawing Sheets

Related U.S. Application Data on Jan. 11, 2016, provisional application No. 62/276,571, filed on Jan. 8, 2016.

(51) Int. Cl.
| | | |
|---|---|---|
| *B23K 26/354* | (2014.01) | |
| *B23K 26/082* | (2014.01) | |
| *B23K 26/0622* | (2014.01) | |
| *B23K 26/08* | (2014.01) | |
| *H01L 27/12* | (2006.01) | |
| *H01L 29/66* | (2006.01) | |
| *H01L 29/786* | (2006.01) | |
| *B23K 103/16* | (2006.01) | |
| *B23K 103/00* | (2006.01) | |
| *B23K 101/40* | (2006.01) | |
| *B23K 26/06* | (2014.01) | |
| *B23K 26/073* | (2006.01) | |

(52) U.S. Cl.
CPC ........ *B23K 26/082* (2015.10); *B23K 26/0861* (2013.01); *B23K 26/354* (2015.10); *H01L 21/02532* (2013.01); *H01L 21/02691* (2013.01); *H01L 27/1274* (2013.01); *H01L 29/6675* (2013.01); *H01L 29/78672* (2013.01); *B23K 26/0626* (2013.01); *B23K 26/073* (2013.01); *B23K 2101/40* (2018.08); *B23K 2103/172* (2018.08); *B23K 2103/56* (2018.08); *H01L 21/02683* (2013.01)

(56) References Cited

U.S. PATENT DOCUMENTS

| | | | | |
|---|---|---|---|---|
| 2001/0010702 | A1* | 8/2001 | Tanaka | H01L 27/1285 372/99 |
| 2002/0160586 | A1* | 10/2002 | Wada | G01N 21/95 438/509 |
| 2004/0253838 | A1* | 12/2004 | Yamazaki | B23K 26/073 359/624 |
| 2005/0217571 | A1* | 10/2005 | Taniguchi | C30B 13/24 117/202 |
| 2005/0237895 | A1* | 10/2005 | Tanaka | B23K 26/0738 369/97 |
| 2006/0194354 | A1* | 8/2006 | Okumura | H01L 21/02678 438/16 |
| 2006/0216037 | A1* | 9/2006 | Wiessner | H01S 3/0057 398/161 |
| 2006/0254500 | A1 | 11/2006 | Im et al. | |
| 2007/0212860 | A1 | 9/2007 | Fujino et al. | |
| 2007/0243698 | A1* | 10/2007 | Chao | H01L 21/2026 438/486 |
| 2008/0030877 | A1* | 2/2008 | Turk | H01L 21/02691 359/719 |
| 2008/0210945 | A1 | 9/2008 | Miyairi | |
| 2011/0121306 | A1* | 5/2011 | Im | H01L 21/02686 257/66 |
| 2012/0260847 | A1* | 10/2012 | Van Der Wilt | B23K 26/0613 117/37 |
| 2013/0105807 | A1 | 5/2013 | Im et al. | |
| 2015/0017793 | A1* | 1/2015 | Hallam | H01L 21/2636 438/540 |
| 2015/0076504 | A1 | 3/2015 | Im | |
| 2015/0177525 | A1* | 6/2015 | Shudo | H01L 29/66348 359/639 |
| 2016/0293414 | A1* | 10/2016 | Adams | H01L 21/02521 |
| 2018/0356706 | A1* | 12/2018 | Acef | H01S 3/2308 |

OTHER PUBLICATIONS

Demtroder, "Lasers" (2006): pp. 283-319. (Year: 2006).*
International Search Report and Written Opinion for International Application No. PCT/US17/12716 dated May 15, 2017 (12 pages).

\* cited by examiner

METHODS AND SYSTEMS FOR SPOT BEAM CRYSTALLIZATION

CROSS-REFERENCE TO RELATED APPLICATIONS

This Application is a national Stage Entry of PCT International Application No. PCT/US2017/12716, entitled "METHODS AND SYSTEMS FOR SPOT BEAM CRYSTALLIZATION," filed Jan. 9, 2017, which claims priority to U.S. Patent Application No. 62/305,818, entitled "HIGH THROUGHPUT, CONTINUOUS MELT SEQUENTIAL LATERAL SOLIDIFICATION," filed on Mar. 9, 2016, and to U.S. Provisional Patent Application No. 62/277,355, entitled "HIGH THROUGHPUT, CONTINUOUS MELT SEQUENTIAL LATERAL SOLIDIFICATION," filed on Jan. 11, 2016, and to U.S. Provisional Patent Application No. 62/276,571, entitled "HIGH THROUGHPUT, CONTINUOUS MELT SEQUENTIAL LATERAL SOLIDIFICATION," filed on Jan. 8, 2016, the contents of which are incorporated herein by reference in their entirety.

TECHNICAL FIELD

The present disclosure relates to methods and systems for processing silicon films using spot beam crystallization techniques.

BACKGROUND

Films, for example, silicon films, can be processed using laser controlled irradiation and melting of the film. The laser controlled melting can create selected crystalline structures in the film. Prior methods of laser crystallization include sequential lateral solidification ("SLS") and excimer laser annealing ("ELA"). Both methods rely on one complete cycle of melting-and-solidification before continuing the processing of the film, for example, before the next pulse or series of pulses irradiates the film, the previously irradiated region of the film undergoes entire melting and solidification cycle and become fully solidified. Further, these methods can produce films with relatively uniform grain sizes of about 0.3 to 3.0 microns, which are sufficient for today's displays and mobile devices, which are around 300 to 500 pixels per inch.

Next generation devices, including devices used for virtual reality viewing, require far higher pixels per inch, e.g., on the order of thousands of pixels per inch, to produce quality images. This requires crystallized films with better uniformity than can be achieved using a long line-beam utilized in the prior ELA and SLS methods. Further, the prior processes involve expensive equipment with high laser maintenance and operating costs and are not efficient.

SUMMARY

The present disclosure relates to methods and systems for a new spot beam crystallization technique where a small laser beam spot is continually advanced across a film to create a sustained complete or partial molten zone that is translated across the film, and crystallizes to form uniform polycrystalline structures or grains. Because these grains can be sized to a micron or less than 0.3 micron, and are highly regular, displays having 3,000 to 5,000 pixels per inch can be created from these films. Further, the disclosed methods and systems can produce these small, uniform grained films with high throughput and efficiency. In general, the disclosed techniques enable a new class of highly efficient and inexpensive lasers with low operating costs to create the same or better materials at higher throughputs and lower costs. These lasers can have a very high frequency and very low pulse energy. For example, single-mode, quasi-continuous wave (QCW) fiber or solid state lasers.

According to aspects of the disclosure, a method for crystallizing a thin film, can include the steps of providing a thin film, providing a laser beam producing a spot on the thin film, and continually translating the laser beam in a first direction while irradiating overlapping regions of the thin film to generate a molten zone by applying a laser pulse in each region, each laser pulse applied before an entire melting-and-solidification cycle has occurred with respect to a previous laser pulse. The method can also include the steps of propagating the molten zone along the first direction creating a molten zone trailing edge surrounded by a solid region, and allowing the molten zone to cool and solidify and form the crystalline region.

According to aspects of the disclosure, a method for processing a thin film, can include the steps of providing a thin film, providing a laser beam producing a spot on the thin film, and continually translating the laser beam in a first direction while irradiating overlapping regions of the thin film to generate a molten zone by applying a laser pulse in each region, each laser pulse applied before an entire melting-and-solidification cycle has occurred with respect to a previous laser pulse. The method can also include the steps of propagating the partially molten zone along the first direction creating a molten zone trailing edge surrounded by a solid region, and allowing the molten zone to cool and solidify and form in the crystalline region periodic regions of first grains having a first periodicity, followed by periodic regions of second grains, wherein the first grains are larger than the second grains.

According to aspects of the disclosure, a system for crystallizing a thin film can include a computer controlled stage, wherein the computer controlled stage holds a thin film and a laser system comprising a laser for generating a laser beam producing a spot on the thin film. The laser system can be configured to continually advance the laser beam in a first direction while irradiating overlapping regions of the thin film to generate a molten zone by applying a laser pulse in each region, each laser pulse applied before an entire melting-and-solidification cycle has occurred with respect to a previous laser pulse. In the system, the molten zone is propagated along the first direction creating a molten zone trailing edge surrounded by a solid region, and the molten zone cools and solidifies and forms the crystalline region.

According to aspects of the disclosure, a system for crystallizing a thin film can include a computer controlled stage, wherein the computer controlled stage holds a thin film and a laser system comprising a laser for generating a laser beam producing a spot on the thin film. The laser system can be configured to continually advance the laser beam in a first direction while irradiating overlapping regions of the thin film to generate a molten zone by applying a laser pulse in each region, each laser pulse applied before an entire melting-and-solidification cycle has occurred with respect to a previous laser pulse. In the system, the molten zone can be propagated along the first direction creating a molten zone trailing edge surrounded by a solid region, and the molten zone cools and solidifies and forms in the crystalline region periodic regions of first grains having a first periodicity, followed by periodic regions of second grains, wherein the first grains are larger than the second grains.

DETAILED DESCRIPTION

The present disclosure relates to methods and systems for a new thin film crystallization technique where a small laser beam spot is continually advanced across a film to create a sustained molten zone that is translated across the film and crystallizes to form uniform, large- or small-grained crystalline structures or grains. Because these grains can be sized to more than a micron or less than 0.3 micron, and are highly uniform, displays having 3,000 to 5,000 pixels per inch can be created from these films. Further, the disclosed methods and systems can produce these small, uniform grained films with high throughput and efficiency. Additionally, the described techniques can produce a film having small, uniform grains without requiring stitching.

Figure 1:
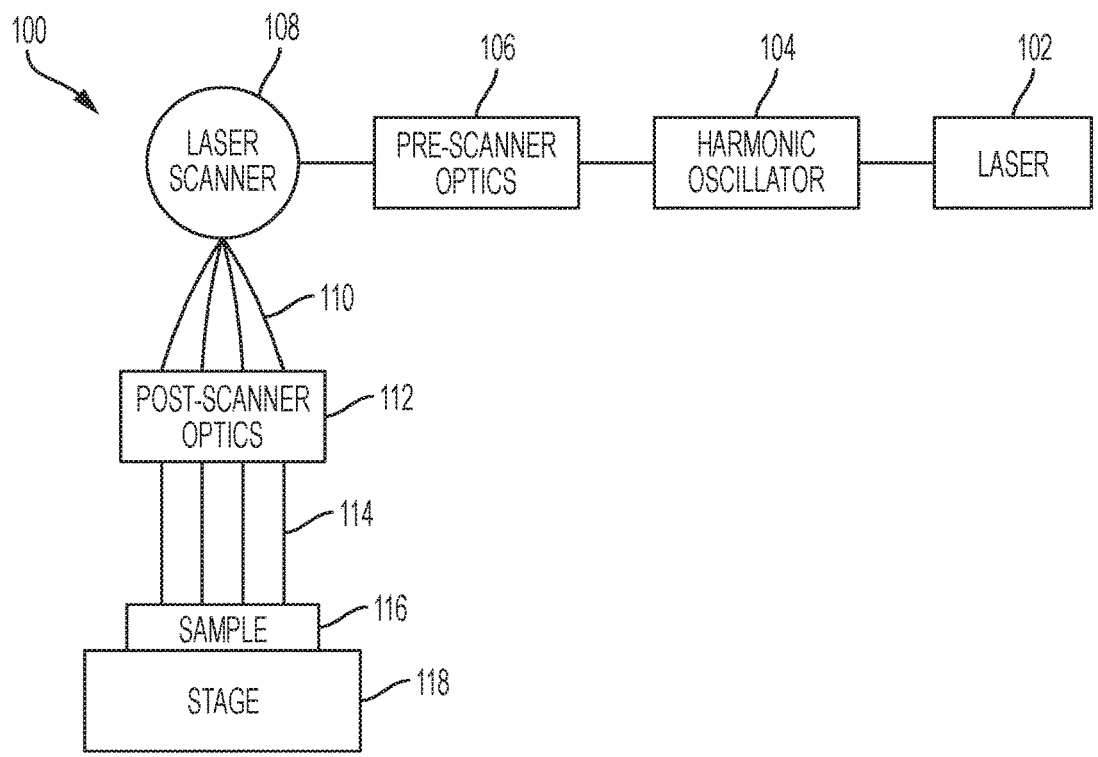
FIG. 1 depicts a system for performing the described sequential lateral solidification technique, according to aspects of the present disclosure.

FIG. 1 depicts a system 100 for performing the described sequential lateral solidification technique. In some embodiments, system 100 can include a laser 102, a harmonic oscillator 104, pre-scanner optics 106, a beam scanner 108, a scanning laser beam 110, post scanner optics 112, a final beam 114, a sample 116, and a stage 118.

In some embodiments, laser 102 can be a high frequency, low pulse energy laser, for example, a quasi-continuous wave solid-state laser or fiber laser. Exemplary high frequency fiber lasers can be manufactured by IPG Photonics, Inc. (Oxford, Mass.). High frequency refers to a frequency of 10 megaheartz to several hundred megahertz, for example, at least 10 MHz or about 100 MHz or 900 MHz. Laser 102 can have a total power of about 100 W to more than 500 W. Laser 102 can have a per pulse energy of less than one to about ten micro Joule. An exemplary laser can have a pulse duration of about one nanosecond or less and separate between pulses of about one nanosecond to about five nanoseconds. Note that laser 102 provides a series of low energy pulses to the sample at the stated frequency, that is, laser 102 is a pulsed laser. For example, a given area of sample 116 can experience 10, 20 and up to 50 or more pulses from laser 102. In some embodiments, continuous melt can occur with only approximately one shot per region, as long as there is some overlap to continue the continuous melting process. Laser 102 can also be very coherent, e.g., having a low $M^2$, forming a nearly perfect Gaussian shape. The beam produced by laser 102 can have both spatial and temporal coherence. Laser 102 also can be a single-mode laser. In some embodiments, laser 102 can have a wavelength in the UV range, e.g., about 355 nm, or can be green, e.g., 532 nm, Laser 102 can produce a narrow, relatively short beam, and, accordingly, producing a narrow, short spot on the film. For example, the beam can be about 10 micron to about 1 mm or about 1 cm in length and about one micron to 100 micron in width. In some embodiments, the beam can be a few microns in length. A beam with these dimensions is referred to herein as a spot beam. While the present methods are described with respect to a circular or oval spot beam, the present teachings also can be applied to other beam shapes, for example, square beams, line beams, and other configuration know to one of ordinary skill in the art. Further, as the dimensions of the beam are lengthened and shortened for a given beam width, it will affect the energy density applied per pulse, where a longer beam will have a lower energy density per pulse (requiring more pulses to melt the film) and a shorter beam with a higher energy density per pulse (requiring less pulses to melt the film).

As noted above, the per pulse energy of laser 102 can be relatively low. For example, for a 200 MHz laser with a power of 200 W, the per pulse energy can be about one micro Joules. This energy is generally not sufficient to completely melt a region of silicon film with a single pulse or shot of the laser beam. However, in some cases, if the beam has an exceedingly small area, the energy can be sufficient to melt the film. Consequently, a plurality of pulses of a reasonable sized spot can be applied to the film in short succession with a high degree of overlap to melt a region of the film. Particularly, a second pulse or shot can be applied before an entire melting and solidification cycle has occurred with respect to the first pulse. This increased overlap, as compared to prior art methods, can be preferred because it provides an averaging effect of energy per pulse (each pulse has some slight energy variation) which can result in a more uniform film. Further, in the described system, laser 102 continually fires, without turning laser 102 on and off, and can continually fire at fixed, high frequencies.

Harmonic oscillator 104 can convert light from laser 102 from an infrared wavelength, e.g., about 1065 nm, to a UV (355 nm) or green (532 nm) wavelength.

Pre-scanner optics 106 processes the beam after harmonic oscillator 104 and before the beam enters scanner 108.

In some embodiments, the described systems and methods require the surface of the film to be scanned at a high speed, for example, at least 0.1 km/s, for example, 10 km/s, and up to 20 or 30 km/s. Existing stages cannot move sample 116 and stage 118 at this rate. Further, the optical systems also cannot be translated at that those speed with the existing technology. Accordingly, the present system can use beam scanner 108 to direct the beam across the sample at such speeds. Exemplary beam scanning techniques include galvanometers, reflective polygons, acousto-optical techniques and electro-optical techniques. Further, other types of beam steering techniques known to one of ordinary skill in the art can be used to obtain the desired scanning frequencies.

Post-scanning optics 112 processes the beam after beam scanner 108. Post-scanner optics 106 can, for example, to focus and shape the beam.

Sample 116 can be any type of film to be processed with laser irradiation, for example, metal or semiconductor films. In some embodiments, the film can be silicon.

Stage 118 can be a stage capable of moving the film in three directions (x, y, and z) below the optical system.

System 100 also can include necessary computer systems for controlling the various components of the system. Additionally, system 100 can include a processor and memory for storing instructions as to how to operate the system according to the methods described below.

Figure 2:
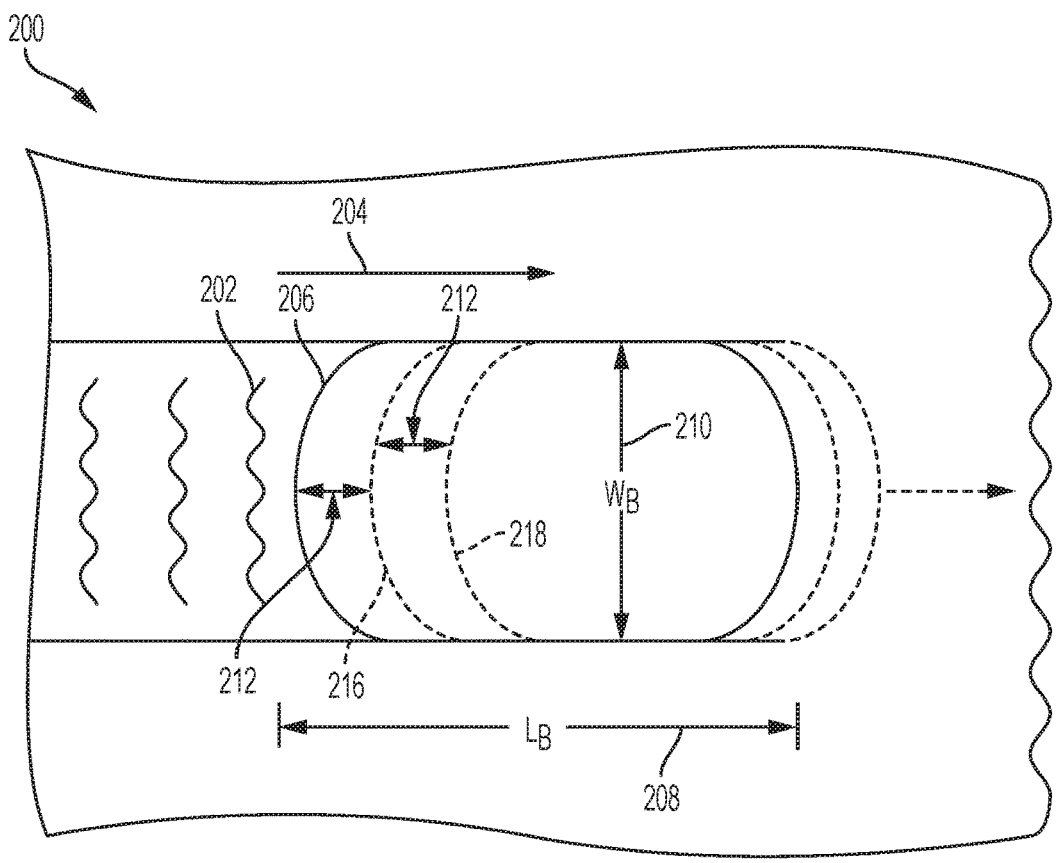
FIG. 2 depicts a top view of a film being processed by the described sequential lateral solidification technique, according to aspects of the present disclosure.
Figure 3:
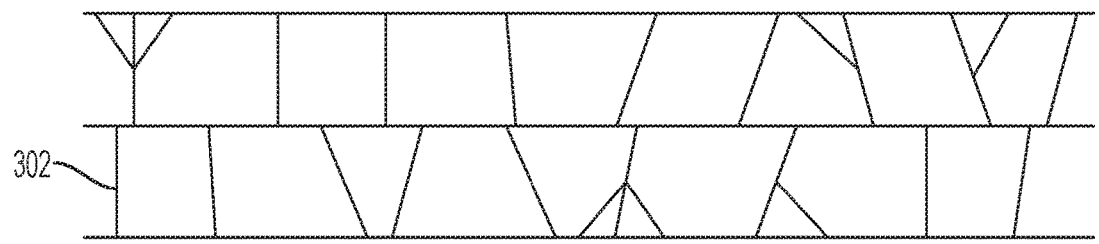
FIG. 3 depicts a film processed according to aspects of the present disclosure.

FIG. 2 depicts a top view of a film 200 being processed by the described sequential lateral solidification technique, according to aspects of the present disclosure. FIG. 2 depicts a portion of film 200 during the described process. Prior pulses from laser 102 have created a complete or partial molten zone 202 that cools and solidifies primarily perpendicular to the direction of beam motion into uniform, small grained crystals (as shown in FIG. 3). After prior laser pulses have completely or partially melted film 200 to form molten zone 202 (prior to crystallization), and as the beam is scanned in direction 204, a first pulse, as depicted in FIG. 2, having length 208 and a width 210, is directed onto film 200 to irradiate and form a first region 206, also having a corresponding length 208 and width 210. The beam is then advanced a distance 212 using beam scanner 108 and a second pulse from the laser is directed onto film 200 to irradiate a second region 216, also having a corresponding length 208 and width 210. The beam is then advanced again the same distance 212, and a third pulse from the laser is directed onto film 200 to irradiate and form a third region 218, also having a corresponding length 208 and width 210. The beam is continually scanned across film 200, while laser 102 continually fires, to create a molten zone 202 across the entire film, which cools and crystallizes to form small, uniform crystal grains.

The translation distance 212 between pulses can be significantly smaller than spot beam length 208. For example, spot beam length 208 can be about 100 micron to 1 cm, and spot beam width 210 can be about one micron. For a 150 MHz laser being scanned at 3.750 km/s, translation distance 212 between pulses can be about 25 microns. For higher frequencies, for example frequency on the order of 500 MHz, translation distance 212 can be less than 10 microns, for example, seven microns. Accordingly, there is significant overlap between pulses and each portion of the film can experience, in some instances 10, 20, 30, 40, 50 or more laser pulses. For shorter spot beam lengths, the distance between pulses can be as small as one micron.

As noted above, depending on the dimensions of the spot beam, the energy of the each laser pulse forming region 206 may not be sufficient to melt region 206. However, by irradiating the same region of the film with a series or 10, 20 or even 100 pulses, the integrated energy density of an area resulting from the overlapping pulses becomes sufficient to melt the irradiated region. For example, the total, integrated energy density a film region can see from multiple overlapping pulses can be about a few hundred micro Joules per square centimeter to about one Joule per square centimeter.

Once the molten zone 202 completely melts, it starts to cool and crystallize from unmelted regions, that is, in the direction primarily perpendicular to the travel of the beam. FIG. 3 depicts an exemplary crystal structure once molten zone 202 has cooled and crystallized. FIG. 3 shows a region of small, uniform crystal grains 302, having a width of approximately 0.5 micron, e.g., the width of the spot beam used for irradiation. In order to crystallize the entire width of the sample, the beam is positioned back to the left edge of the film, translated a set distance in a direction perpendicular to the scan direction and a second scan is performed. The translation distance perpendicular to the scan direction can be set based on the selected resultant crystal structure. The individual crystal grains can have a size of less than 0.5 microns, for example, about 0.3 microns.

Figure 4:
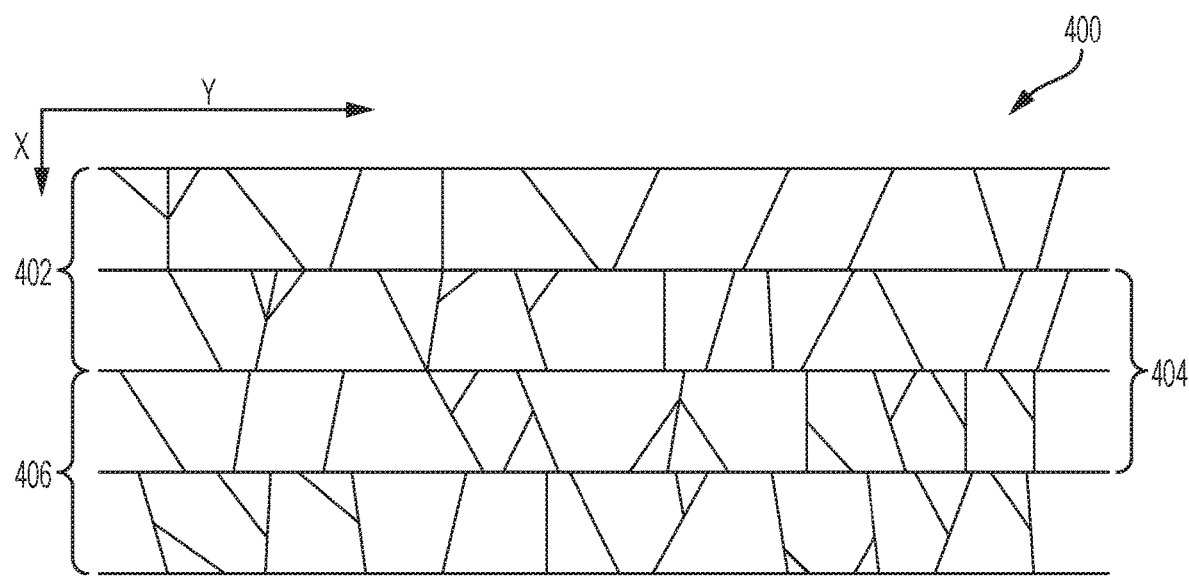
FIG. 4 depicts a film processed according to aspects of the present disclosure.

For example, FIG. 4 depicts a processed film 400, where three scans have been performed. A first scan melts and crystallizes region 402. The beam is then translated in the y direction, i.e., the direction perpendicular to the scan direction, a distance more than the lateral growth length of the crystal structure (but less than twice the lateral growth length), and a second scan is performed to melt and crystallize region 404. In other words, the overlap between region 402 and 406 is more than (but less than twice) the lateral growth length. Again, the beam is translated in they direction, a distance more than (but less than twice) the lateral growth length of the crystal structure and a third scan is performed to melt and crystallize region 406. This process is performed until the entire film is crystallized. The resulting film contains highly uniform, small crystal grains. For example, in some embodiments, the crystal grains can be about 0.3 to about 0.5 microns. Further processing of these films can be done to form transistors to produce a display having 1,000; 2,000 and up to 5,000 pixels per inch. These screens can then be used for virtual reality applications, or other applications requiring very high pixel density.

In another embodiment, the film can be translated less than the lateral growth length between scans. This results in a different microstructure having long crystal grains. It should also be noted that the crystals grow in a direction perpendicular to the direction of the scan.

Prior sequential lateral solidification technique, for example, those disclosed in U.S. Pat. No. 6,555,449, titled "Methods for producing uniform large-grained and grain boundary location manipulated polycrystalline thin film semiconductors using sequential lateral solidification," the entire disclosure of which is incorporated by reference, require an entire melting and solidification cycle before the film is irradiated and melted by the next pulse. Because the method of the present disclosure uses a high frequency laser, with low pulse energy, this method does not rely on an entire melting and solidification cycle for each pulse. Instead, a complete or partial molten zone is created by irradiating each region of the molten zone multiple times, and propagating the molten zone along the length of the film in the direction of the beam scan. Accordingly, the next irradiation occurs before the prior region has been laterally explosively crystallized, which leads to the formation of non-uniform grains. The molten zone then continuously crystallizes behind the progress of the beam scan. Maximum explosive crystallization rates are only about 15 m/s, at most. For example, if the beam is being scanned at 10 of 15 km/s, the explosive crystallization front can be proceeding at about 15 m/s, orders of magnitude lower than the speed of the beam scan. Consequently, the present method does not suffer from non-uniformity caused by explosive crystallization in the direction of the scan.

Figure 5A:
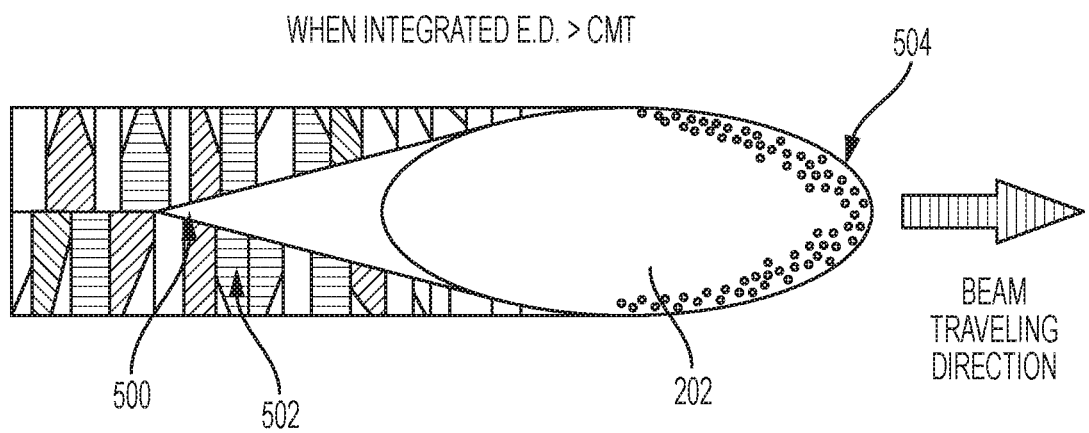
FIGS. 5A and 5B depict top views of a molten zone of film processed using spot beam crystallization ("SBC") techniques, according to aspects of the present disclosure.

Accordingly, the methods disclosed herein scan at rates faster than the maximum solidification rate, e.g., 15 m/s, such that the detrimental explosive crystallization process lags behind the rate at which the film is irradiated and melted. As a result, the films produced by this technique have an improved crystalline structure. FIG. 5A depicts a top view of a molten zone 202 of a film processed according to the described complete melting techniques. In the example of FIG. 5A, the integrated, e.g., accumulated, energy density from the pulses in the overlapping regions is higher than the energy density required for complete melting. As molten zone 202 cools, solidifies, and crystallizes, a molten tail 500, is formed, surrounded by crystalline region 502. That is, the film laterally solidifies from the edges of the molten zone 202 into the center and the crystallization proceeds from the outside in to the center. This provides short, straight grains 502, instead of angled grains. The tail 500 can be approximately 1 mm behind the front of the beam 504. Zone 202 in this example can be completely molten.

Figure 5B:
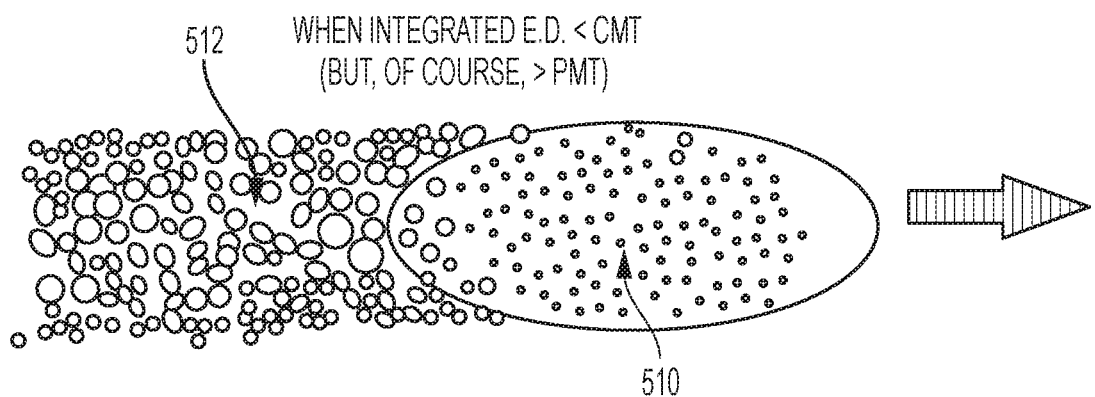

FIG. 5B depicts a top view of a molten zone 510 of a film processed according to the described partial melting techniques. In the example of FIG. 5B, the integrated, e.g., accumulated, energy density from the pulses in the overlapping regions is lower than the energy density required for complete melting, but higher than the energy density required for complete melting. When the zone 510 is partially molten, solidification proceeds from the distributed solid seeds surviving inside the molten region, resulting in small equiaxed grain structure (region 512), instead of long and directional grains obtained under full melting condition and sequential lateral solidification.

Further, while prior sequential lateral solidification techniques can produce uniform grains, the grain size in prior techniques, e.g., 2.5 to 3.5 microns, is significantly larger than the 0.3 to 1.0 micron grain sizes achievable by the techniques of the present disclosure by making use of more coherent solid state lasers.

Because the beam scan proceeds at such a high speed, films can be processed efficiently. Further, the lasers implemented in this method are less expensive to operate and the methods can produce a higher crystallization rate per Watt. This provides a much lower cost per Watt for manufacturing and a highly efficient process overall.

While other laser crystallization techniques, for example, the excimer laser annealing techniques disclosed in United States Patent Application Publication No. 2015/0076504, "Advanced Excimer Laser Annealing for Thin Films," the entire contents of which are hereby incorporated by reference, can produce relatively small grains, these techniques generally do not produce the uniform crystal structure produced by the disclosed methods, due to the non-uniform long line beam, and shot-to-shot energy fluctuation, and necessary for displays having 1,000 or more pixels per inch. Exemplary displays created using the described techniques can be organic light emitting diode displays for virtual reality, mobile, personal computer, and other larger displays, for example televisions.

In some embodiments, the molten zone and the corresponding crystal structure can be formed at an angle with respect to the edge of the film or sample or display screen. This technique is referred to as beam tilting with respect to the edge of the film or screen.

In some embodiments, the laser source can be continuous wave laser or an electron beam. In some embodiments, beam rastering method can be used to scan the beam.

In some embodiments, the length of the spot beam can be reduced. In these embodiments, because the spot beam will have a smaller area, each pulse will impart more energy to irradiated region and fewer pulses will be required to fully melt a given region of the film. Other beam shapes also can be used, for example, donut shapes, chevron or other types of shapes that would create a continuous, moving molten zone. In some embodiments, an approximately single pulse method can also be used.

In some embodiments, in order to avoid edge regions, i.e., regions with poor crystal structure because the region was not irradiated with sufficient energy to substantially melt the film, the scanning process can begin prior to the beam being positioned over the film or display screen, such that each product region of the film experiences the requisite number of pulses to produce the requisite crystalline structure. In other embodiments, edge regions with poor crystal structure can be removed post laser irradiation.

In some embodiments, the present system and method can also be used to perform a partial melt crystallization process. For example, the quasi-continuous wave laser can be used to partially melt the film, instead of completely melting the irradiated region of the film.

Figure 6:
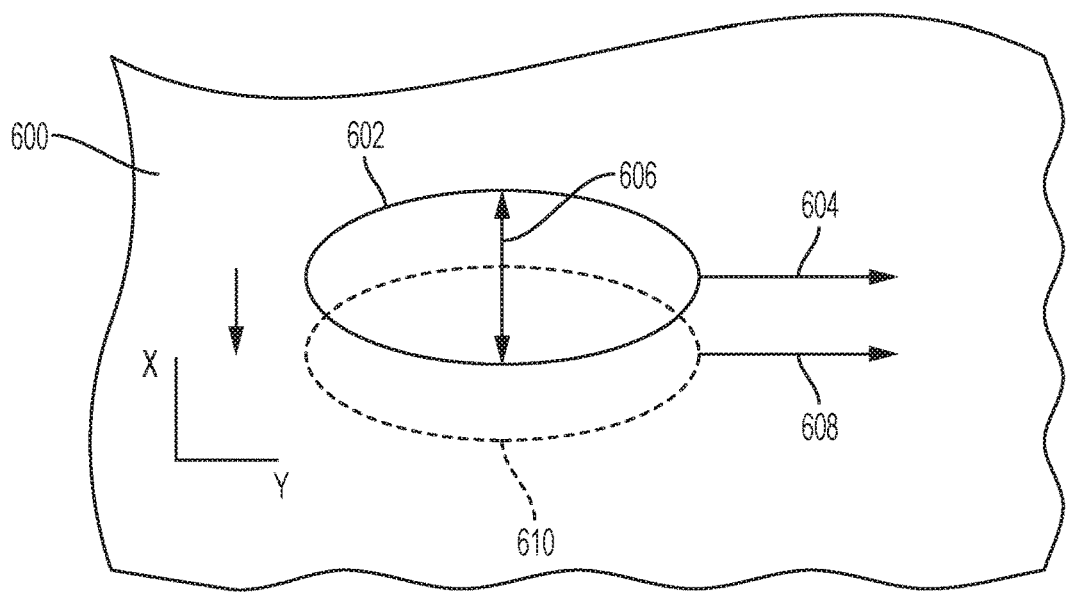
FIG. 6 depicts laser irradiation of a film processed using partial melting techniques, according to aspects of the present disclosure.

FIG. 6 depicts laser irradiation of a film 600 according to the described partial melting method. A first scan 604 can occur in the positive y direction resulting in irradiation of region 602, having a width 606. In order to achieve partial melting, the total energy density can be lowered by shaping a beam with a larger width 606. For example, the width 606 can be about one micron to about one hundred microns. The overlap of each pulse or shot in the direction of the scan 604 of the partial melting method can be similar to the method described above, e.g., about 1-50 shots per unit area. Once the first scan 604 is complete, the beam is moved to begin a second scan 608. The second scan 608 starts at region 610 moved in the negative y direction, perpendicular to the direction of the scan. The overlap between two consecutive scans can range from about one micron to more than ten microns. Accordingly, the same point on a film can see multiple scans, for example, as few as less than two and up to about 50 scans.

Figure 7:
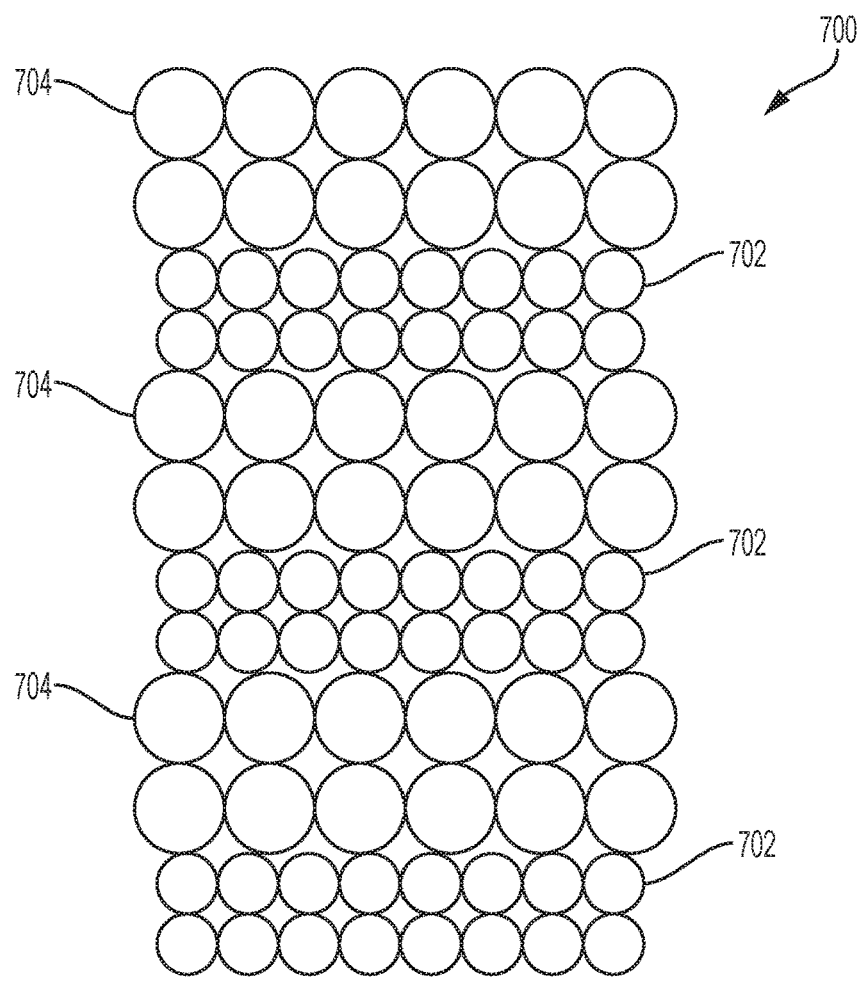
FIG. 7 depicts an exemplary grain structure for a film processed using partial melting techniques, according to aspects of the present disclosure.

FIG. 7 depicts an exemplary grain structure 700 for a film processed using the described partial melting techniques with a very few scans, leading to very high crystallization rates. The resulting high-throughput and low-processing-cost material can have small grains, but may not be uniform. However, the non-uniformities may be somewhat regular, such that the irregularities can repeat. For example, the film can have periods of small grains 702 and periods of slightly larger grains 704. The irregularities can repeat at similar or smaller distances compared to the device dimensions. Accordingly, optimal positioning of the devices on the film can be used to create uniform thin film transistors.

As with the sequential lateral solidification techniques, the beam can be scanned at a high rate, e.g., 10 km/s or 15 km/s, or at least faster than 15 m/s. This is advantageous for the partial melting technique as it can eliminate the participation of explosive crystallization and thereby produce better quality films without the negative effects of explosive crystallization.

Further, in order to compensate for some of the non-uniformity in produced crystal grains in this partial melting method, the devices can be aligned and/or tilted with respect to the processed material to improve uniformity.

Another aspect of the present disclosure relates to a method and system for performing partial melt crystallization using a fiber laser. This technique is referred to herein as Fiber Laser Annealing or "FLA." The system and technique for FLA is similar to that of the partial melting technique described above. A spot beam is created with a high frequency, e.g., 100-900 MHz, fiber laser. The spot beam can be more circular than the line beam (having a width of 1 micron) formed for the complete melting application discussed above. For example, the spot beam can have a width of 5, 10, 20, or 50 microns, and a height of about 50 microns to about 1 mm. The exact shape of the beam spot can be manipulated to deliver the appropriate amount of accumulated energy density to partially melt the film.

Figure 8A:
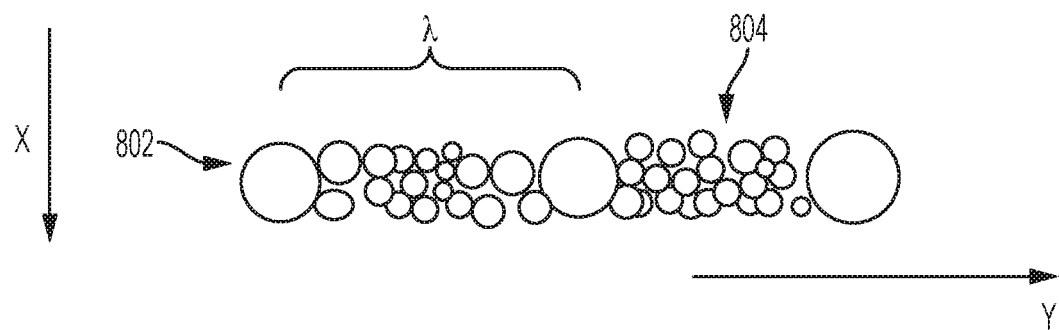
FIG. 8A depicts a crystal structure of film processed with one scan according to the disclosed Fiber Laser Annealing ("FLA") method.
Figure 8B:
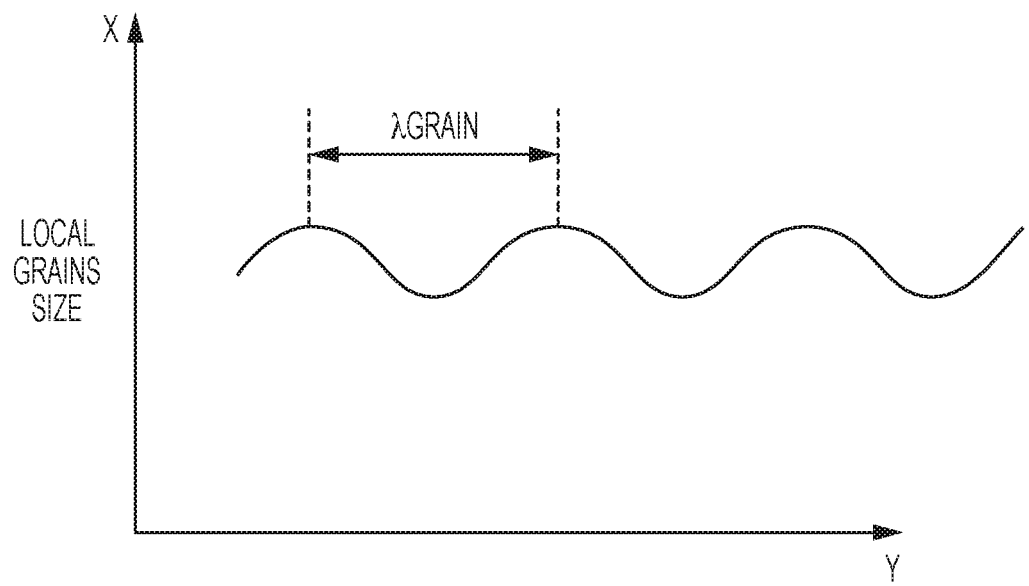
FIG. 8B depicts a graph of grain size vs. distance in they direction for a film scanned using the disclosed FLA techniques.

This FLA method can produce a film having a crystal structure depicted in FIG. 8A. FIG. 8A depicts a crystal structure 800 of film processed with minimally overlapped approximately one scan according the disclosed FLA method. Crystal structure 800 includes periodic regions of large grains 802, followed by periodic regions of small grains 804, each having a periodicity $\lambda$. As repeated scans are performed in the y direction, but shifted down in the x direction, the periodicity will repeat, such that repeated scans will have the same grain structure in the x direction. FIG. 8B depicts a graph of grain size vs. distance in the x direction for a film scanned using the disclosed FLA techniques. FIG. 8B shows the periodicity of the characteristic grain size variation, $\lambda_{grain}$.

Figure 9A:
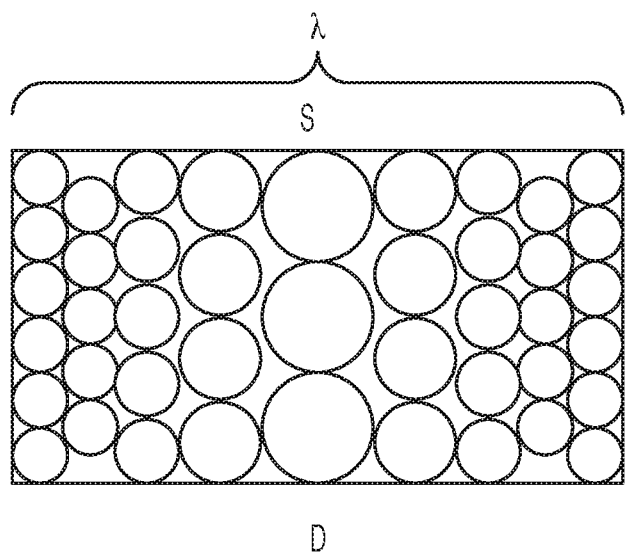
FIG. 9A depicts a transistor formed within a single period of grain structure disclosed in FIG. 8A, according to aspects of the present disclosure.
Figure 9B:
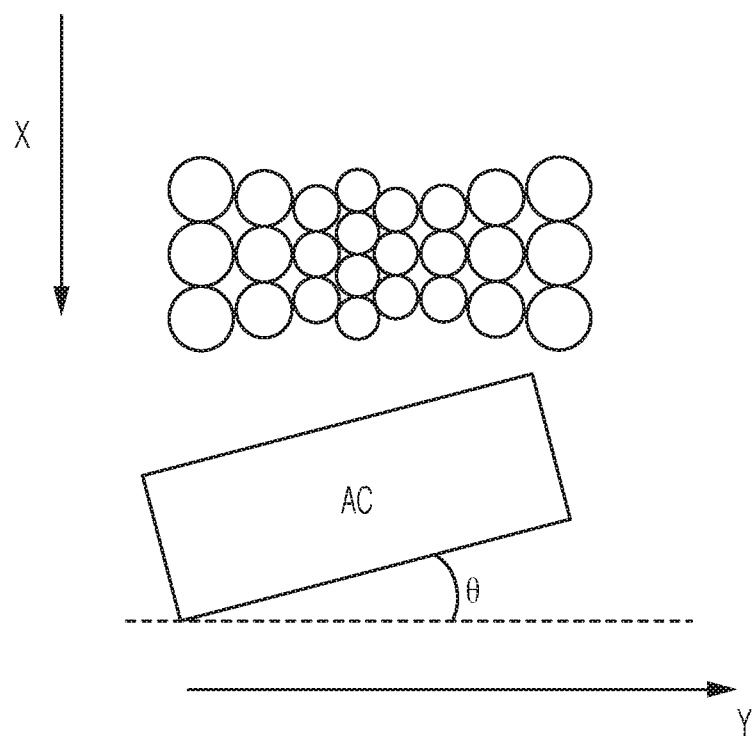
FIG. 9B depicts an active channel AC formed within a single period of grain structure shown in FIG. 8A, but tilted at an angle θ from they axis, according to aspects of the present disclosure.

The grain structure produced by the FLA technique can be used to form active channels for transistors. For example, FIG. 9A depicts a transistor formed within a single period of grain structure disclosed in FIG. 8A. Source S and drain D can be formed near the large grains and the device can be sized to fit within period $\lambda$. FIG. 9B depicts an active channel AC formed within a single period of grain structure shown in FIG. 8A, but tilted at an angle $\theta$ from the y axis. Placing the transistors within the periodicity $\lambda$ can create uniform transistors in a film that has a periodically non-uniform grain size.

Figure 10:
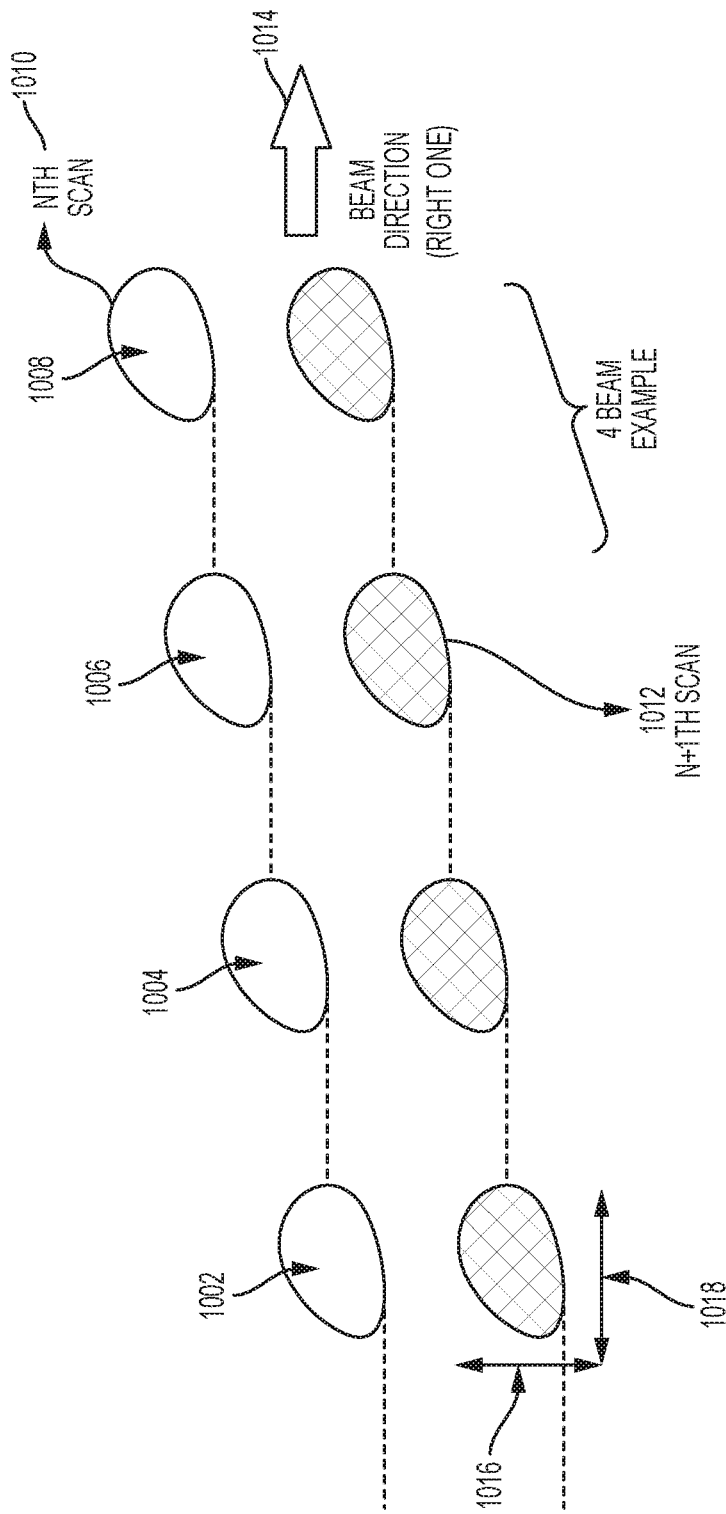
FIG. 10 depicts a FLA scan using four different beams, according to aspects of the present disclosure.

FIG. 10 depicts a FLA scan using four different spot beams, according to aspects of the present disclosure. In this example, a film is scanned in a scan direction 1014 with four beams 1002, 1004, 1006, 1008. The four spot beams 1002, 1004, 1006, 1008 can be created from one laser, e.g., using a beam splitter to take a beam from a single laser and split it into four beams. This can be done using a configuration of mirrors. In other embodiments, two lasers can be used, splitting each beam into two to create four beams, or four separate lasers can be used. For example, if two lasers are used, each, for example, 150 MHz laser can produce a 1 ns pulse with a pulse spacing of 5.5 ns, providing an effective energy corresponding to a 300 MHz laser. Or, a 300 MHz laser can be used, with the beam divided into four beams. By using four separate beams, the microstructural periodicity $\lambda$ of the resultant film can be reduced, by either half or by a quarter, depending on the technique, which can provide more averaging and reduced scale of variation of defects within an active region and thereby provide more uniform transistors formed within those active regions across the film. The periodicity can be reduced in this technique because the step distance between each pulse in the series of four pulses can be reduced.

Because the beam is being split at least in half and sometimes into four but still has to have sufficient energy to partially melt the film, the size of the spot beams are reduced. For example, the width 1018 can remain the same, but the height 1016 can be reduced to about 10 microns to about 250 microns. Accordingly, in some embodiments, the spot beam can have a width of about 5 microns and height of about 10 microns. In order to crystallize the entire film, a plurality of scans can be performed to irradiate the entire film with the plurality of spot beams. For example, FIG. 10 depicts an nth scan 1010 and an N+1th scan 1012. Exemplary scans rates can be about a few hundred to about a few thousand meters per second. Exemplary scan frequencies can be about 1 kHz to about 10-20 kHz.

For both complete and partial melting techniques, the present disclosure can reduce the number and extent of surface protrusions in the processed film. Protrusions in the positive z direction of the film, i.e., the top surface of the film, can be caused by the atoms in liquid entirely surrounded by solid regions of the crystallizing film being forced upward during the crystallization process during which the density of Si decreases. The continuously present molten zone of the present disclosure can reduce these device processing and performance-detrimental protrusions because the liquid atoms cannot be fully trapped and surrounded by solid, as they are more connected with the molten area during crystallization.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processor of any kind of digital computer. Generally, a processor will receive instructions and data from a read only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. Information carriers suitable for embodying computer program instructions and data include all forms of nonvolatile memory, including by way of example semiconductor memory devices, (e.g., EPROM, EEPROM, and flash memory devices); magnetic disks, (e.g., internal hard disks or removable disks); magneto optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The subject matter described herein can be implemented in a computing system that includes a back end component (e.g., a data server), a middleware component (e.g., an application server), or a front end component (e.g., a client computer having a graphical user interface or a web browser through which a user can interact with an implementation of the subject matter described herein), or any combination of such back end, middleware, and front end components. The components of the system can be interconnected by any form or medium of digital data communication, e.g., a communication network. Examples of communication networks include a local area network ("LAN") and a wide area network ("WAN"), e.g., the Internet.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out the several purposes of the disclosed subject matter. It is important, therefore, that the claims be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

The invention claimed is:

1. A system for crystallizing a thin film, the system comprising:
a computer controlled stage, wherein the computer controlled stage holds a thin film; and
a laser system comprising a laser for generating a plurality of laser beams with a beam splitter, wherein the plurality of laser beams produce a plurality of spots on the thin film, the laser system configured to:
continually translate the plurality of laser beams in a first direction while irradiating overlapping regions of the thin film to generate a plurality of molten zones by applying a laser pulse in each region, each laser pulse applied before an entire melting and solidification cycle has occurred with respect to a previous laser pulse;
wherein each of the plurality of molten zones creates a molten zone trailing edge surrounded by a solid region; and
wherein each of the plurality of molten zones cools and solidifies and forms a crystalline region.

2. The system of claim 1, wherein the laser system is further configured to:
translate the plurality of laser beams a first distance in a second direction perpendicular to the first direction; and
continually translate the laser beam in a third direction opposite to the first direction, while irradiating second overlapping regions of the thin film;
wherein the first distance is shorter than a lateral growth length of a crystal structure in the crystalline region.

3. The system of claim 2, wherein the laser system is further configured to:
translate the plurality of laser beams a second distance in the second direction perpendicular to the first direction; and
continually translate the plurality of laser beams in the first direction, while irradiating third overlapping regions of the thin film;
wherein the second distance is shorter than the lateral growth length of the crystal structure in the crystalline region.

4. The system of claim 1, wherein an energy of the laser pulse is between 0.1 micro Joule and 100 micro Joule.

5. The system of claim 1, wherein a duration of the laser pulse is between 0.1 nanosecond and 10 nanosecond, and a time between consecutive laser pulses is less than 100 nanosecond.

6. The system of claim 1, wherein the laser is one of a quasi-continuous wave solid-state laser, an electron beam, and a fiber laser.

7. The system of claim 1, wherein a frequency of the laser is constant and the constant frequency is obtained by combining laser sources of lower frequencies.

8. The system of claim 1, wherein a scan rate of the plurality of laser beams in the first direction is between 100 and 20,000 meters per second.

9. The system of claim 1, wherein a scan frequency of the plurality of laser beams is between 1 and 100 kHz.

10. A system for processing a thin film, the system comprising:
a computer controlled stage, wherein the computer controlled stage holds a thin film; and
a laser system comprising a laser for generating a plurality of laser beams with a beam splitter, wherein the plurality of laser beams produce a plurality of spots on the thin film, the laser system configured to:
continually translate the plurality of laser beam in a first direction while irradiating overlapping regions of the thin film to generate a plurality of molten zones by applying a laser pulse in each region, each laser pulse applied before an entire melting and solidification cycle has occurred with respect to a previous laser pulse;

wherein each of the plurality of molten zones creates a molten zone trailing edge surrounded by a solid region; and each of the plurality of molten zones cools and solidifies and forms crystalline periodic regions of first grains having a first periodicity, followed by periodic regions of second grains, wherein the first grains are larger than the second grains.

11. The system of claim 10, wherein the plurality of laser beams are produced using a fiber laser and a pulse energy is sufficient to partially melt the thin film.

12. The system of claim 10, wherein an energy of the laser pulse is between 0.1 micro Joule and 100 micro Joule.

13. The system of claim 10, wherein a duration of the laser pulse is between 0.1 nanosecond and 10 nanosecond, and a time between consecutive laser pulses is less than 100 nanosecond.

14. The system of claim 10, wherein the laser is one of a quasi-continuous wave solid-state laser, an electron beam, and a fiber laser.

15. The system of claim 10, wherein a frequency of the laser is constant and the constant frequency is obtained by combining laser sources of lower frequencies.

* * * * *

UNITED STATES PATENT AND TRADEMARK OFFICE
CERTIFICATE OF CORRECTION

| | | |
|---|---|---|
| PATENT NO. | : 11,437,236 B2 | Page 1 of 1 |
| APPLICATION NO. | : 16/069150 | |
| DATED | : September 6, 2022 | |
| INVENTOR(S) | : James S. Im et al. | |

It is certified that error appears in the above-identified patent and that said Letters Patent is hereby corrected as shown below:

On the Title Page

Item (86) PCT No. should read: PCT/US2017/012716

Signed and Sealed this
Twenty-fifth Day of October, 2022

Katherine Kelly Vidal
*Director of the United States Patent and Trademark Office*